United States Patent
Kikuchi

(10) Patent No.: US 8,609,552 B2
(45) Date of Patent: Dec. 17, 2013

(54) METHOD FOR CONTROLLING DANGLING BONDS IN FLUOROCARBON FILMS

(75) Inventor: Yoshiyuki Kikuchi, Sendai (JP)

(73) Assignee: Tokyo Electron Limited, Tokyo (JP)

( * ) Notice: Subject to any disclaimer, the term of this patent is extended or adjusted under 35 U.S.C. 154(b) by 320 days.

(21) Appl. No.: 13/153,326

(22) Filed: Jun. 3, 2011

(65) Prior Publication Data
US 2011/0300717 A1 Dec. 8, 2011

Related U.S. Application Data

(60) Provisional application No. 61/469,349, filed on Mar. 30, 2011, provisional application No. 61/396,972, filed on Jun. 4, 2010.

(51) Int. Cl.
*H01L 21/31* (2006.01)
(52) U.S. Cl.
USPC .......... 438/778; 438/780; 257/410; 427/331; 427/358; 427/371; 427/384

(58) Field of Classification Search
USPC .......... 438/761, 771, 772, 778, 780; 257/410, 257/411
See application file for complete search history.

(56) References Cited

U.S. PATENT DOCUMENTS

2010/0090315 A1* 4/2010 Horigome ............... 257/618

\* cited by examiner

*Primary Examiner* — Hsien Ming Lee

(57) ABSTRACT

Embodiments of the invention describe methods for forming fluorocarbon (CF) films for semiconductor devices. According to one embodiment, the method includes providing a substrate, depositing a CF film on the substrate, generating, in the absence of a plasma, a treatment gas containing a gaseous specie having a molecular dipole, and treating the CF film with the treatment gas containing the gaseous specie having the molecular dipole to reduce the number of dangling bonds in the CF film. According to some embodiments, the method further includes depositing a second CF film on the treated CF film. According to some embodiments, the CF films may be deposited using a microwave plasma source containing a radial line slot antenna (RLSA).

20 Claims, 12 Drawing Sheets

METHOD FOR CONTROLLING DANGLING BONDS IN FLUOROCARBON FILMS

CROSS-REFERENCE TO RELATED APPLICATIONS

This application is related to and claims priority to U.S. Provisional application Ser. No. 61/396,972 filed on Jun. 4, 2010, and U.S. Provisional application Ser. No. 61/469,349 filed on Mar. 30, 2011, the entire contents of these applications are herein incorporated by reference.

FIELD OF THE INVENTION

The present invention generally relates to depositing dielectric films on a substrate, and in particular to a method for depositing fluorocarbon (CF) films.

BACKGROUND OF THE INVENTION

In a manufacturing process for electronic devices, such as semiconductor devices, liquid crystal display devices, and organic electro-luminescent (EL) elements, a film forming process is performed to form a conductive film or an insulating film on the surface of a substrate. A plasma-assisted film forming process for forming a film on a substrate using plasma is often employed in this film forming process, for example for depositing interlayer dielectrics (ILDs) for integrated circuits.

Fluorocarbon (CF) films are promising materials for use as low-dielectric constant (low-k) ILDs and other applications. A problem that is commonly encountered when integrating a CF film with other materials is that the contact between the CF film and the other materials thermally deteriorates during further processing. The further processing can include annealing of a copper wiring layer formed in recessed features of the ILDs. The cause of the thermal deterioration is thought to be a decomposition reaction in the CF film due to the presence of dangling bonds in the CF film. The dangling bonds include unsaturated carbon bonds that lack fluorine atoms. The thermal deterioration results in fluorine diffusion and can lead to reduced adhesion between the CF film and the other materials in the integrated circuit. Eventually, the reduced adhesion can lead to film corrosion and film peeling that may be observed as film blistering on the substrate.

However, it is difficult to prepare high quality CF films by plasma processing, as well as CF films that have low concentration of dangling bonds and good thermal stability. Increasing the thermal stability of the CF films prevents or reduces the fluorine atom diffusion and improves adhesion between the CF films and the other materials in contact with the CF films. Attempts to reduce the amount of fluorine on the surface of the CF film have included performing a thermal treatment of the CF film before depositing other material layers on the CF film, or depositing a titanium metal on the CF film due to the relatively good adhesion properties at the interface of these two materials. However, these attempts have not yielded manufacturable solutions and new methods are needed for depositing CF films having a low concentration of dangling bonds and good thermal stability.

SUMMARY OF THE INVENTION

Embodiments of the invention describe a method for depositing CF films having a low concentration of dangling bonds and good thermal stability.

According to one embodiment, the method includes providing a substrate, depositing a fluorocarbon (CF) film on the substrate, generating, in the absence of a plasma, a treatment gas containing a gaseous specie having a molecular dipole, and treating the CF film with the treatment gas containing the gaseous specie having the molecular dipole to reduce the number of dangling bonds in the CF film. According to another embodiment, the method further includes depositing a second CF film on the treated CF film.

According to another embodiment, the method includes providing a substrate, forming a first plasma from a first process gas containing fluorine and carbon, depositing a first fluorocarbon (CF) film on the substrate by exposing the substrate to the first plasma, generating, in the absence of a plasma, a treatment gas containing a gaseous specie having a molecular dipole, and treating the first CF film with the gaseous specie having the molecular dipole to reduce the number of dangling bonds in the first CF film. The method further includes forming a second plasma from a second process gas containing fluorine and carbon, and depositing a second CF film on the treated first CF film by exposing the treated CF film to the second plasma.

According to yet another embodiment, the method includes providing a substrate in a plasma processing chamber; forming a first plasma from a first process gas containing $C_5F_8$, depositing a first fluorocarbon (CF) film on the substrate by exposing the substrate to the first plasma, thermally generating a difluorocarbene ($CF_2$) radical in the absence of a plasma, where the $CF_2$ radical is generated by thermal decomposition of hexafluoropropylene oxide (HFPO), and treating the first CF film with the $CF_2$ radical to reduce the number of dangling bonds in the first CF film. The method further includes forming a second plasma from a second process gas containing $C_5F_8$, and depositing a second CF film on the treated first CF film by exposing the treated first CF film to the second plasma, where the first and second plasmas are formed by a microwave plasma source containing a radial line slot antenna (RLSA).

DETAILED DESCRIPTION OF SEVERAL EMBODIMENTS

Methods for depositing CF films with low concentrations of dangling bonds and good thermal stability are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but does not denote that they are present in every embodiment. Thus, the appearances of the terms "one embodiment" or "an embodiment" in various places throughout this specification are not necessarily referring to the same embodiment of the invention.

Figure 7:
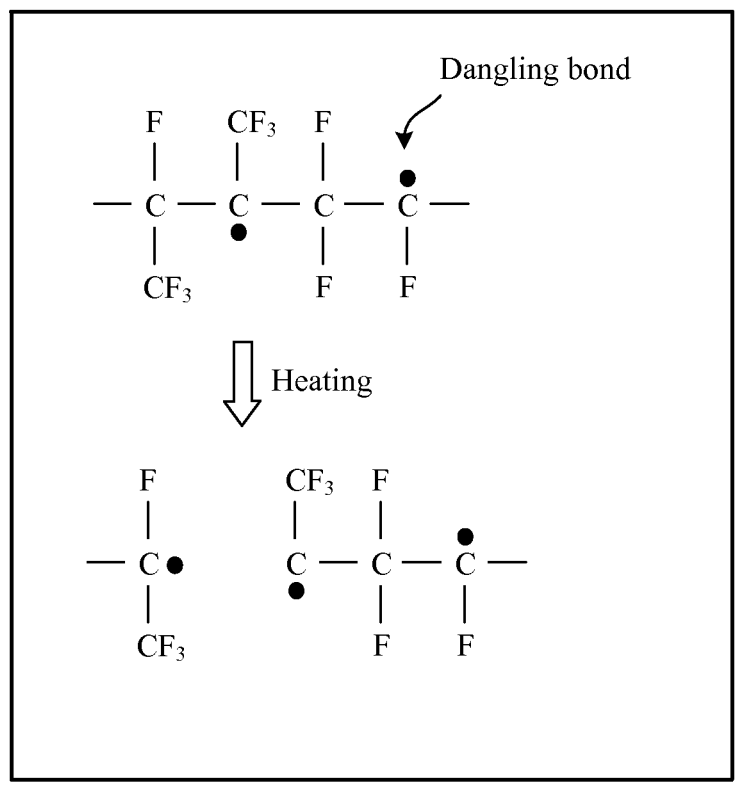
FIG. 7 schematically shows thermal decomposition of a CF film containing dangling bonds.

There is a general need in semiconductor manufacturing for new methods for depositing CF films with a low concentration of dangling bonds and good thermal stability in order to enable the use of these films in advanced semiconductor devices. As described above, it is difficult to prepare high quality CF films by plasma processing. FIG. 7 schematically shows thermal decomposition of a CF film containing dangling bonds. The dangling bonds are thought to be preferentially located at points in the CF film where $CF_3$ groups are attached to the C—C chain. Upon heating the CF film, the C—C bond breaks near the dangling bond as the CF film starts to decompose. Thermal desorption data showed that decomposition of the CF film released gaseous $CF_3$ species (corresponding to a mass spectrometer signal having mass (m) to charge (z) ratio of 69) at CF film temperatures of 600° C. and above. $CF_2$ (m/z=50) and CF (m/z=31) fragments were also detected.

The inventors have realized that CF films with atomic ratio $C/F \approx 1$, low concentration of dangling bonds, and good thermal stability may be formed on a substrate by forming a plasma from a process gas containing fluorine and carbon, the plasma being excited by a microwave plasma source, and depositing a CF film on the substrate by exposing the substrate to the plasma. The method further includes generating, in the absence of the plasma (and/or in the absence of any other plasma), a treatment gas containing a gaseous specie having a molecular dipole, and treating the CF film with the treatment gas containing the gaseous specie having the molecular dipole to reduce the number of dangling bonds in the CF film. According to some embodiments, the gaseous specie having the molecular dipole can include water ($H_2O$), ammonia ($NH_3$), or difluorocarbene ($CF_2$). According to other embodiments, the CF films may be deposited onto the substrate by a plasma formed using a radio frequency (RF) plasma, for example. Although some embodiments describe depositing CF films using plasma processing, other embodiments are not so limited. According to some embodiments, the CF films may be deposited on the substrate by a non-plasma process, for example by atomic layer deposition (ALD), chemical vapor deposition (CVD), or filament-assisted CVD (FACVD).

Treating the CF film with the treatment gas containing the gaseous specie having the molecular dipole is thought to result in attraction and attachment of the negative end (i.e., O in $H_2O$) of the molecular dipole to the dangling bond on the unsaturated carbon that lack fluorine atoms. In the case of $H_2O$, the treating is further thought to incorporate additional $H_2O$ (or OH) into the CF film where the additional $H_2O$ (or OH) may be released from the CF film and aid in deposition of a second CF film on the CF film treated with the treatment gas.

According to an embodiment, the method includes providing a substrate, forming a first plasma from a first process gas containing fluorine and carbon, the first plasma being excited by a microwave plasma source that includes a radial line slot antenna (RLSA), and depositing a first fluorocarbon (CF) film on the substrate by exposing the substrate to the first plasma. The method further includes generating, in the absence of the plasma (and/or in the absence of any other plasma), a treatment gas containing a gaseous specie having a molecular dipole, and treating the first CF film with the treatment gas containing the gaseous specie having the molecular dipole to reduce the number of dangling bonds in the first CF film and/or incorporate the gaseous specie into the first CF film. The method further includes forming a second plasma from a second process gas containing fluorine and carbon, the second plasma being excited by the microwave plasma source, and depositing a second CF film on the first CF film by exposing the substrate to the second plasma following the treating of the first CF film, wherein the gaseous specie (i.e., $H_2O$, OH, $NH_3$, $NH_2$, or NH) may be released from the first CF film during deposition of the second CF film and incorporated into the second CF film where the gaseous specie are effective in terminating dangling bonds in the second CF film. Thus the resulting combined CF film containing the first and second CF films contains few dangling bonds. The first CF film may be deposited at a relatively low deposition rate and the second CF film may be deposited at a higher film deposition rate than the first CF film. Since the second CF film can be much thicker than the first CF film (e.g., 100 nanometers (nm) versus 10 nm), this method provides a manufacturable solution for rapidly forming thick CF films with few dangling bonds and good thermal stability.

According to another embodiment, the method includes providing a substrate, forming a first plasma from a first process gas containing $C_5F_8$, the first plasma being excited by a microwave plasma source that contains a radial line slot antenna (RLSA), and depositing a first fluorocarbon (CF) film on the substrate by exposing the substrate to the first plasma. The method further includes thermally generating difluorocarbene ($CF_2$) radicals in the absence of the plasma (and/or in the absence of any other plasma), wherein the $CF_2$ radicals are generated by thermal decomposition of hexafluoropropylene oxide (HFPO), and treating the first CF film with the $CF_2$ radicals to reduce the number of dangling bonds in the first CF film. The method further includes forming a second plasma from a second process gas containing $C_5F_8$, the second plasma being excited by the microwave plasma source, and depositing a second CF film on the first CF film by exposing the substrate to the second plasma following the treating of the first CF film. According to embodiments of the invention, the exposed surface of the first CF film treated with the $CF_2$ radicals provides a high quality CF deposition surface that enables deposition of the second CF film with few dangling bonds and good thermal stability. The first CF film may be deposited at a relatively low deposition rate and the second CF film may be deposited at a higher film deposition rate than the first CF film. Since the second CF film can be much thicker than the first CF film (e.g., 100 nm versus 10 nm), this method provides a manufacturable solution for rapidly forming thick CF films with few dangling bonds and good thermal stability.

The difluorocarbene ($CF_2$) radicals may be formed in-situ by thermal decomposition of a treatment gas (e.g., a $CF_2$-containing molecule such as hexafluoropropylene oxide (HFPO)) in the absence of plasma. HFPO thermally decomposes to form a $CF_2$ radical and trifluoroacetyl fluoride. The $CF_2$ radical reacts with an unsaturated carbon dangling bond in the CF film that lacks a fluorine atom and the trifluoroacetyl fluoride byproduct is removed from the process chamber. The reaction of the $CF_2$ radical with the unsaturated carbon dangling bond is thought to terminate the unsaturated carbon dangling bond in the CF film which results in the treated CF film having few dangling bonds and good thermal stability. The formation of $CF_2$ radicals by thermal decomposition of a treatment gas provides a highly controllable method for forming $CF_2$ radicals and terminating dangling bonds in a CF film. In contrast, formation of $CF_2$ radicals by plasma decomposition further creates various ions and excited molecules that are unsuitable for treating dangling bonds in CF films.

Figure 1:
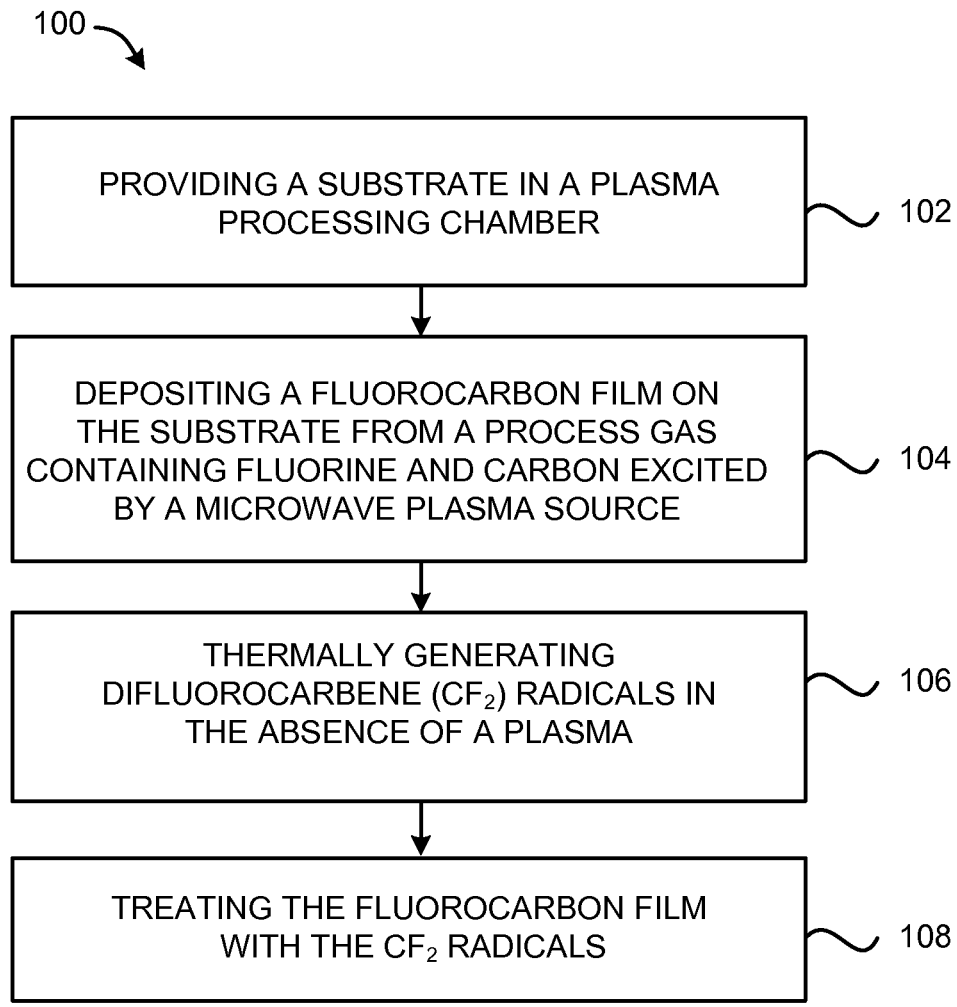
FIG. 1 is a flow diagram for forming a CF film on a substrate according to an embodiment of the invention.

FIG. 1 is a flow diagram 100 for forming a CF film on a substrate according to an embodiment of the invention. The flow diagram 100 includes, in 102, providing a substrate on a substrate holder in a plasma processing chamber. The plasma processing chamber contains a microwave plasma source, for example a radial line slot antenna (RLSA) as schematically shown in FIGS. 8-11. The substrate can, for example, be a semiconductor substrate, such as a silicon substrate, a silicon germanium substrate, a germanium substrate, a glass substrate, a LCD substrate, or a compound semiconductor substrate, such as GaAs. The substrate can be of any size, for example, a 200 mm wafer, a 300 mm wafer, or an even larger wafer or substrate. In one example, the substrate can contain an etch stop film (e.g., SiN, $SiO_2$, SiON, SiCO, SiCN, or amorphous carbon) formed thereon.

In 104, a fluorocarbon (CF) film is deposited on the substrate from a process gas containing fluorine and carbon that is excited by the microwave plasma source to form plasma. The process gas containing fluorine and carbon can include a $C_aF_b$ gas that contains $C_4F_4$, $C_4F_6$, $C_6F_6$, or $C_5F_8$, or a combination of two or more thereof. Other $C_aF_b$ gases are also contemplated and may be used. The inventors have realized that $C_5F_8$ is very well suited for depositing CF films because the $C_5F_8$ molecule has a C≡C triple bond that is not broken during the plasma processing due to the low electron temperature (e.g., less than about 5 eV, or between about 1 and about 2 eV) in the microwave plasma and the C≡C molecular unit is incorporated into the CF film. Gas flow rates of the $C_aF_b$ gas can be less than 500 standard cubic centimeters per minute (sccm), less than 200 sccm, or less than 100 sccm. In some examples, the process gas can further contain a noble gas (e.g., argon (Ar)), nitrogen ($N_2$), or both a noble gas (e.g., Ar) and $N_2$. Gas flow rates of the Ar and $N_2$ gas can be less than 500 sccm, less than 200 sccm, or less than 100 sccm. The gas pressure in the plasma processing chamber can be less than 100 mTorr, less than 50 mTorr, less than 30 mTorr, or less than 20 mTorr, for example. The substrate holder can be maintained at a temperature greater than 200° C., greater than 300° C., or greater than 400° C. In some examples, the substrate holder can be maintained at a temperature greater than 310° C., greater than 320° C., or greater than 330° C. In one example, the substrate holder can be maintained at a temperature of approximately 330° C. The microwave plasma power applied by the microwave plasma source can, for example, be between 10 Watt (W) and 200 W, or between 20 W and 100 W. A substrate holder supporting the substrate may be biased with a radio frequency (RF) power source. The RF bias power applied to the substrate holder can, for example, be between 10 W and 200 W, or between 20 W and 100 W.

In one example, a 10 nm thick CF film may be deposited in step 104 using a gas pressure of about 23 mTorr, a microwave power of about 50 W, RF bias power of about 25 W, a process gas of $C_5F_8$/Ar/$N_2$ with respective gas flows of 190/80/20 sccm.

In 106, difluorocarbene ($CF_2$) radicals are thermally generated in the absence of the plasma in 104 (and/or in the absence of any other plasma). In one example, the $CF_2$ radicals may be formed by flowing a treatment gas containing hexafluoropropylene oxide (HFPO) gas into the plasma processing chamber, wherein the $CF_2$ radicals may be formed when the HFPO thermally interacts with the heated substrate. In one example, the substrate may be heated to a temperature of about 150° C., or greater. In some examples, the substrate may be heated to a temperature between about 100° C. and about 200° C., between about 200° C. and about 300° C., or between about 300° C. and about 400° C. The gas pressure in the plasma processing chamber during the HFPO exposure can be between 10 mTorr and 10 Torr, for example between 10 mTorr and 100 mTorr, between 100 mTorr and 1 Torr, or between 1 Torr and 10 Torr. In 108, the CF film is treated with the $CF_2$ radicals to reduce the number of dangling bonds in the CF film.

According to other embodiments, the $CF_2$ radicals may be formed by flowing the treatment gas through a remote excitation source. The remote excitation source may be configured for generating $CF_2$ radicals in the absence of plasma from the treatment gas (e.g., HFPO) supplied from a treatment gas source. Thereafter, the $CF_2$ radicals may be flowed into the processing chamber for treating a CF film on the substrate. Alternately, the remote excitation source may be located inside the processing chamber for treating the CF film. In one example, the processing chamber for treating the CF film may be the same processing chamber used for depositing the CF film. However, this is not required as the processing chamber for treating the CF film may be different than the processing chamber used for depositing the CF film.

According to one embodiment, the remote excitation source can contain heating elements (e.g., resistive heating elements) configured to heat the treatment gas to a temperature between 100° C. and 500° C., or between 300° C. and 500° C., to generate $CF_2$ radicals from thermal (non-plasma) dissociation of the treatment gas. According to one embodiment, the remote excitation source can contain one or more heated filaments (e.g., a resistive heated tungsten wire filament) configured to heat the treatment gas to thermally generate $CF_2$ radicals. According to one embodiment, the substrate temperature (or the temperature of the substrate holder) may be lower than the temperature of the remote excitation source when the remote excitation source is used to thermally generate $CF_2$ radicals from the treatment gas. It is contemplated that lowering the substrate temperature (or the temperature of the substrate holder) can enhance the termination of the dangling bonds by the remotely generated $CF_2$ radicals. For example, the substrate temperature can be lower than 100° C., between 0° C. and 100° C., between 0° C. and 25° C., between 25° C. and 50° C., or between 50° C. and 100° C.

Figure 2:
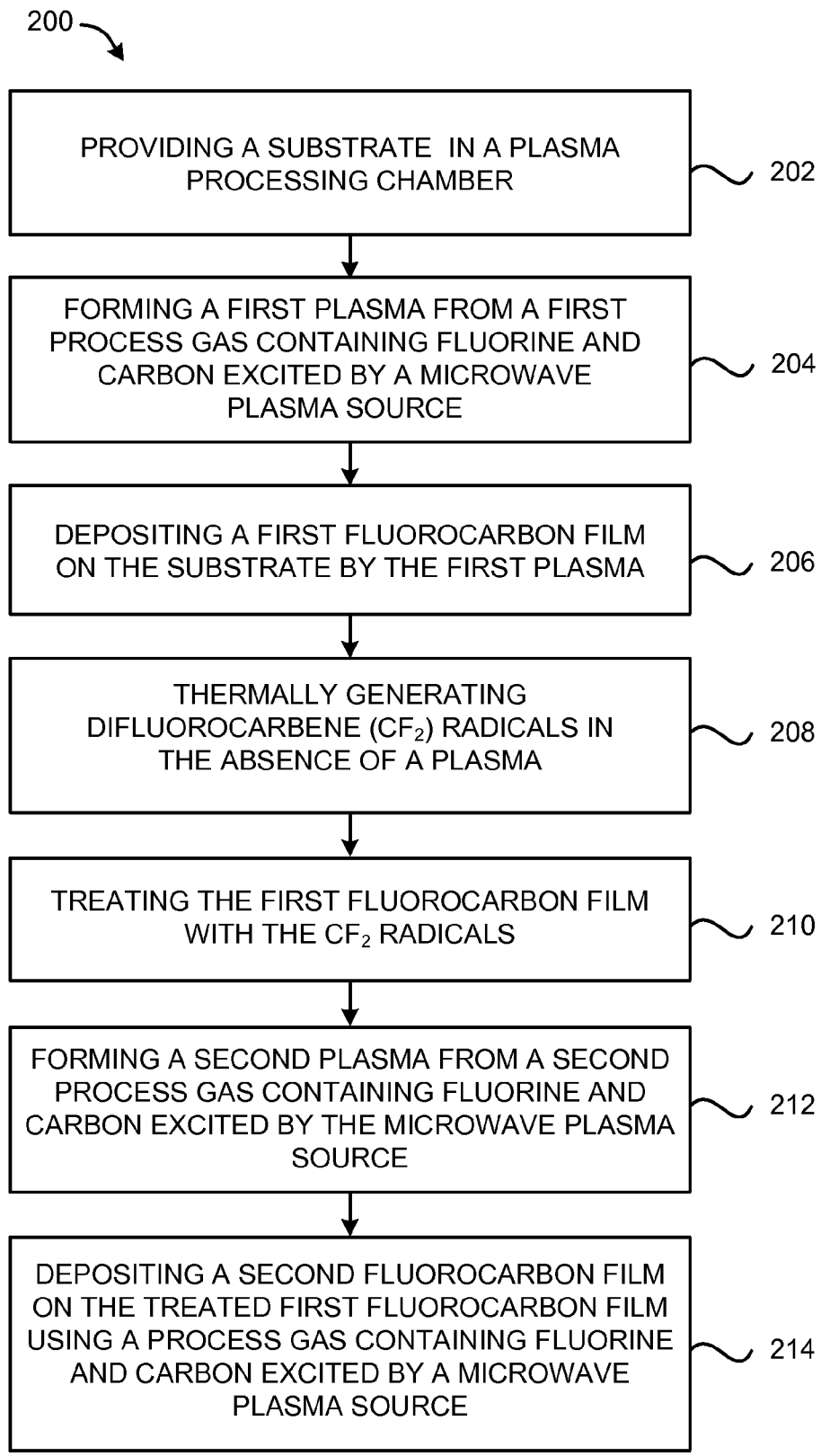
FIG. 2 is a flow diagram for forming a CF film on a substrate according to an embodiment of the invention.

FIG. 2 is a flow diagram 200 for forming a CF film on a substrate according to an embodiment of the invention and FIGS. 3A-3F schematically show formation of a CF film on a substrate according to an embodiment of the invention. Referring both to FIGS. 2 and 3A-3F, the flow diagram 200 includes, in 202, providing a substrate 300 on a substrate holder in a plasma processing chamber. According to some embodiments, a first etch stop film 302 (e.g., SiN, SiO$_2$, SiON, SiCO, SiCN, or amorphous carbon) may be present on the substrate 300. According to other embodiments, the first etch stop film 302 may be omitted. The plasma processing chamber can contain a microwave antenna, a microwave power source for powering the microwave antenna, a radio frequency (RF) power source for RF biasing the substrate holder, and optionally a direct current (DC) voltage source for DC biasing the substrate holder. The microwave antenna can include a radial line slot antenna (RLSA) as schematically shown in FIGS. 8-11. The substrate 300 can, for example, be a semiconductor substrate, such as a silicon substrate, a silicon germanium substrate, a germanium substrate, a glass substrate, a LCD substrate, or a compound semiconductor substrate such as GaAs. The substrate can be of any size, for example, a 200 mm wafer, a 300 mm wafer, or an even larger wafer or substrate.

In 204, a first process gas containing fluorine and carbon is introduced in the plasma processing chamber and a first plasma is formed from the first process gas using a microwave plasma source. The first process gas containing fluorine and carbon can include a $C_aF_b$ gas that contains $C_4F_4$, $C_4F_6$, $C_6F_6$, or $C_5F_8$, or a combination of two or more thereof. Other $C_aF_b$ gases are also contemplated and may be used. Gas flow rates of the $C_aF_b$ gas can be less than 500 sccm, less than 200 sccm, or less than 100 sccm. In some examples, the first process gas can further contain Ar, N$_2$, or both Ar and N$_2$. Gas flow rates of the Ar and N$_2$ gas can be less than 500 sccm, less than 200 sccm, or less than 100 sccm. The gas pressure in the plasma processing chamber can be less than 100 mTorr, less than 50 mTorr, less than 30 mTorr, or less than 20 mTorr, for example. The substrate holder can be maintained at a temperature greater than 200° C., greater than 300° C., or greater than 400° C. In some examples, the substrate holder can be maintained at a temperature greater than 310° C., greater than 320° C., or greater than 330° C. In one example, the substrate holder can be maintained at a temperature of approximately 330° C. The microwave plasma power applied by the microwave plasma source can, for example, be between 10 W and 200 W, or between 20 W and 100 W. A substrate holder supporting the substrate may be biased with a RF power source. The RF bias power applied to the substrate holder can, for example, be between 10 W and 200 W, or between 20 W and 100 W.

Figure 3A:
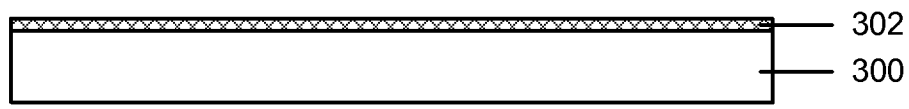
FIGS. 3A-3F schematically shows formation of a CF film on a substrate according to an embodiment of the invention.
Figure 3B:
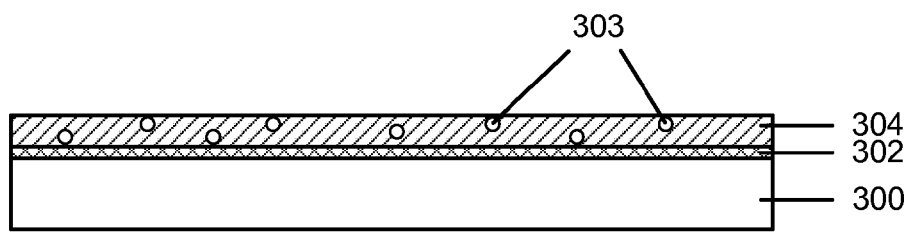
Figure 3C:
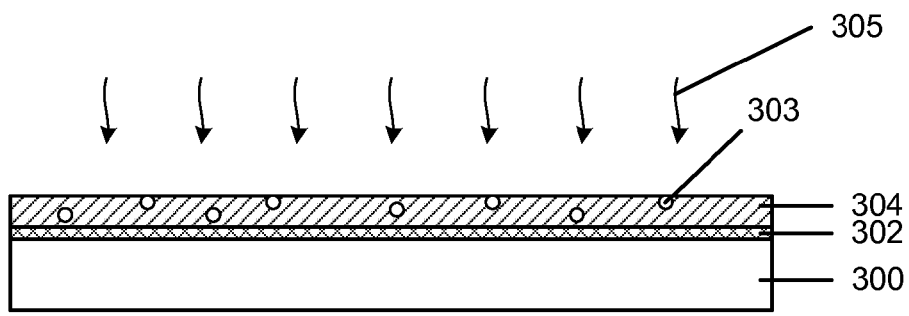

In 206, a first CF film 304, depicted in FIG. 3B, is deposited on the first etch stop film 302 by exposing the substrate to the first plasma. In one example, the first CF film 304 may be formed using a chamber pressure of 23 mTorr, a microwave power of 50 W, a RF bias power of 25 W, and a first process gas composition of $C_5F_8$/Ar/N$_2$ having respective gas flows of 190/80/20 sccm. These processing conditions can deposit a first CF film with a deposition rate of about 18 nm/min (e.g., 20 nm in 130 sec). In some examples, a thickness of the first CF film 304 can be 20 nm or less, for example between 5 nm and 20 nm, or between 5 nm and 10 nm, and can be about 10 nm. FIG. 3B schematically depicts the presence of dangling bonds 303 in the first CF film 304.

In 208, CF$_2$ radicals 305 (FIG. 3C) are thermally generated in the absence of plasma. In one example, the CF$_2$ radicals 305 may be generated by thermal decomposition of the treatment gas above substrate 300, or at a surface of substrate 300 which is heated. In one example, the CF$_2$ radicals 305 may be formed by flowing HFPO gas into the processing chamber, and interacting the HFPO with substrate 300 which is heated. However, other treatment gases that are capable of thermally forming CF$_2$ radicals 305 in the absence of plasma are also contemplated and may be used. According to other embodiments, CF$_2$ radicals may be formed by flowing a treatment gas through a remote excitation source as described above.

Figure 3D:
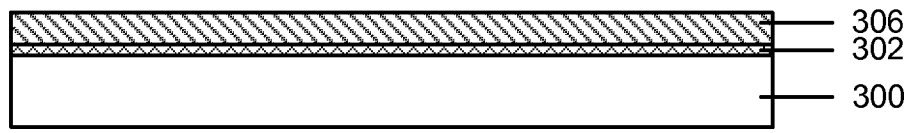
Figure 3E:
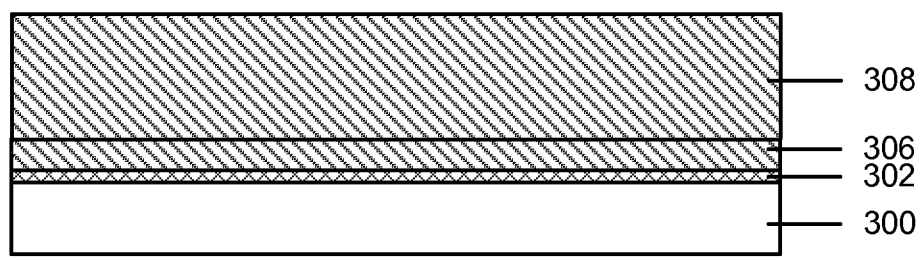

In 210, the first CF film 304 is treated with the CF$_2$ radicals 305 to reduce the number of the dangling bonds 303 in the first CF film 304. The dangling bonds 303 are thought to be present throughout the entire thickness of the first CF film 304 and, therefore, it is expected that the treating with CF$_2$ radicals 305 is more effective for the first CF film 304 when the first CF film is very thin, for example having a thickness that is less than 20 nm, less than 10 nm, between 5 nm and 10 nm, or between 10 nm and 20 nm. FIG. 3D schematically shows a treated first CF film 306, wherein the dangling bonds 303 have been terminated by the CF$_2$ radicals 305.

In 212, a second process gas containing fluorine and carbon is introduced in the plasma processing chamber and a second plasma is formed from the second process gas using the microwave plasma source. According to some embodiments, the second process gas containing fluorine and carbon can include a $C_aF_b$ gas that contains $C_4F_4$, $C_4F_6$, $C_6F_6$, or $C_5F_8$, or a combination of two or more thereof. Other $C_aF_b$ gases are also contemplated and may be used. Gas flow rates of the $C_aF_b$ gas can be less than 500 sccm, less than 200 sccm, or less than 100 sccm. In some examples, the first process gas can further contain Ar, N$_2$, or both Ar and N$_2$. Gas flow rates of the Ar and N$_2$ gas can be less than 500 sccm, less than 200 sccm, or less than 100 sccm. The gas pressure in the plasma processing chamber can be less than 100 mTorr, less than 50 mTorr, less than 30 mTorr, or less than 20 mTorr, for example. The substrate holder can be maintained at a temperature greater than 200° C., greater than 300° C., or greater than 400° C. In some examples, the substrate holder can be maintained at a temperature greater than 310° C., greater than 320° C., or greater than 330° C. In one example, the substrate holder can be maintained at a temperature of approximately 330° C. The microwave plasma power applied by the microwave plasma source can, for example, be between 200 W and 1500 W, or between 1000 W and 1500 W. A substrate holder supporting the substrate may be biased with a RF power source. The RF bias power applied to the substrate holder can, for example, be between 10 W and 200 W, or between 20 W and 100 W.

In 214, a second CF film 308 (FIG. 3E) is deposited on the treated first CF film 306 by the second plasma. In one example, the second CF film 308 may be formed using a chamber pressure of 23 mTorr, microwave power of 1350 W, RF bias power of 25 W, and first process gas composition of $C_5F_8$/Ar/N$_2$ having respective gas flows of 190/80/20 sccm. These processing conditions can deposit a second CF film with a deposition rate of about 102 nm/min (110 nm in 130 sec). In one example, a thickness of the second CF film can be 30 nm or greater, for example between 30 nm and 200 nm, or between 100 nm and 150 nm. According to some embodiments, the first CF film 304 may be thinner than the second CF film 308. According to one embodiment, the first CF film 304 may be deposited at a lower deposition rate than the second CF film 308. The lower deposition rate may be achieved using a lower microwave power in step 206 than in step 214. The treated first CF film 306 and the second CF film 308 form a combined CF film 310.

As described above, the exposed surface of the treated first CF film 306 provides a high quality CF deposition surface that enables deposition of the second CF film 308 with few dangling bonds and good thermal stability. The first CF film 306 may be deposited at a low deposition rate and the second CF film 308 may be deposited at a higher film deposition rate than the first CF film 306. Since the second CF film 308 can be much thicker than the first CF film 306 (e.g., 100 nm vs 10 nm), this method provides a manufacturable solution for rapidly forming a thick combined CF film 310 with few dangling bonds and good thermal stability.

Figure 3F:
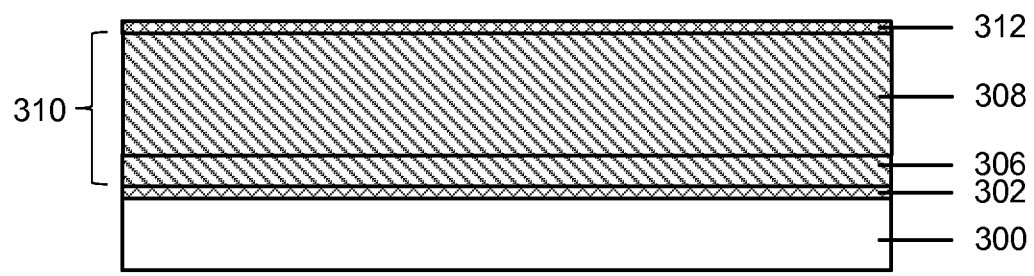

Following deposition of the second CF film 308, as depicted in FIG. 3F, a second etch stop film 312 (e.g., SiN, $SiO_2$, SiON, SiCO, SiCN, or amorphous carbon) may be deposited on the second CF film 308. According other embodiments, the second etch stop film 312 may be omitted.

According to another embodiment of the invention, a method is provided for controlling dangling bonds in a CF film by introducing a molecule having a dipole moment, i.e., $H_2O$ or $NH_3$, into the CF film. The following examples describe the use of $H_2O$ for controlling dangling bonds in a CF film. It is believed that $H_2O$ stabilizes the CF film by terminating the dangling bonds in the CF film and further provides a source of $H_2O$ that is released from the CF film during deposition of a second CF film on the first CF film, wherein dangling bonds in the second CF film have few dangling bonds and good thermal stability. The first CF film may be deposited at a low deposition rate and the second CF film may be deposited at a higher film deposition rate than the first CF film. Since the second CF film can be much thicker than the first CF film (e.g., 100 nm vs 10 nm), this method provides a manufacturable solution for forming thick combined CF film with few dangling bonds and good thermal stability.

Figure 4:
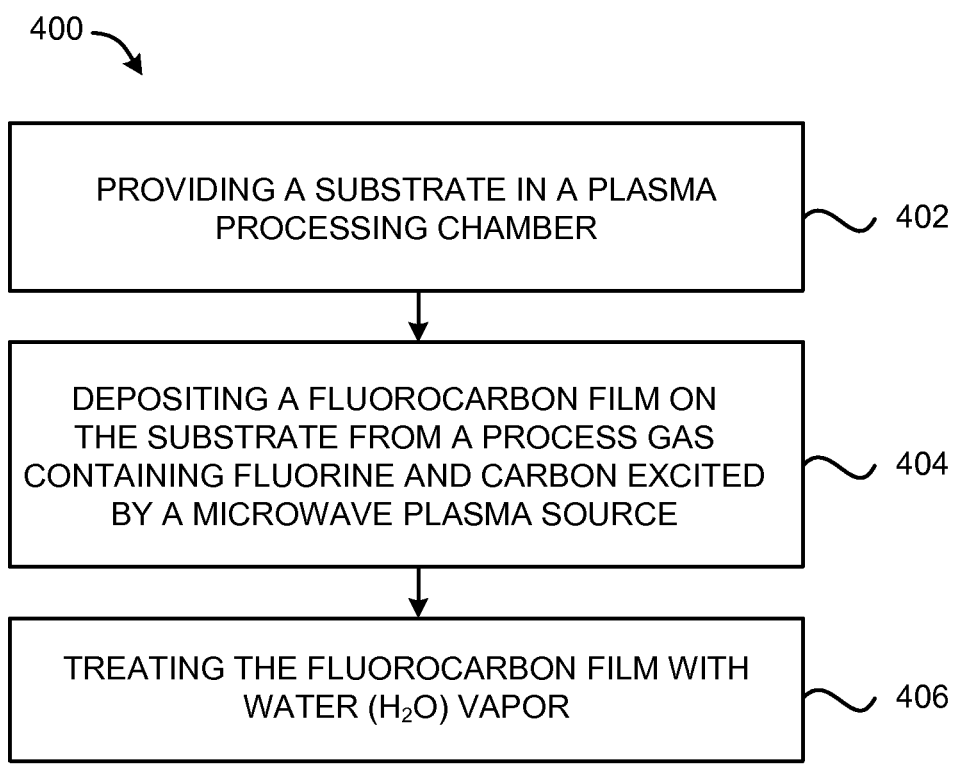
FIG. 4 is a flow diagram for forming a CF film on a substrate according to an embodiment of the invention.

FIG. 4 is a flow diagram 400 for forming a CF film on a substrate according to an embodiment of the invention. The flow diagram 400 includes, in 402, providing a substrate on a substrate holder in a plasma processing chamber. The plasma processing chamber contains a microwave plasma source, for example, a radial line slot antenna (RLSA) as schematically shown in FIGS. 8-11. The substrate can, for example, be a semiconductor substrate, such as a silicon substrate, a silicon germanium substrate, a germanium substrate, a glass substrate, a LCD substrate, or a compound semiconductor substrate such as GaAs. The substrate can be of any size, for example, a 200 mm wafer, a 300 mm wafer, or an even larger wafer or substrate. In one example, the substrate can contain an etch stop film (e.g., SiN, $SiO_2$, SiON, SiCO, SiCN, or amorphous carbon) thereon.

In 404, a fluorocarbon (CF) film is deposited on the substrate from a process gas containing fluorine and carbon that is excited by a microwave plasma source to form plasma. The process gas containing fluorine and carbon can include a $C_aF_b$ gas that contains $C_4F_4$, $C_4F_6$, $C_6F_6$, or $C_5F_8$, or a combination of two or more thereof. Other $C_aF_b$ gases are also contemplated and may be used. Gas flow rates of the $C_aF_b$ gas can be less than 500 sccm, less than 200 sccm, or less than 100 sccm. In some examples, the process gas can further contain Ar, nitrogen $N_2$, or both Ar and $N_2$. Gas flow rates of the Ar and $N_2$ gas can be less than 500 sccm, less than 200 sccm, or less than 100 sccm. The gas pressure in the plasma processing chamber can be less than 100 mTorr, less than 50 mTorr, less than 30 mTorr, or less than 20 mTorr, for example. The substrate holder can be maintained at a temperature greater than 200° C., greater than 300° C., or greater than 400° C. In some examples, the substrate holder can be maintained at a temperature greater than 310° C., greater than 320° C., or greater than 330° C. In one example, the substrate holder can be maintained at a temperature of approximately 330° C. The microwave plasma power applied by the microwave plasma source can, for example, be between 10 W and 200 W, or between 20 W and 100 W. A substrate holder supporting the substrate may be biased with a RF power source. The RF bias power applied to the substrate holder can, for example, be between 10 W and 200 W, or between 20 W and 100 W.

In one example, a 10 nm thick CF film may be deposited in step 404 using a gas pressure of about 23 mTorr, a microwave power of about 50 W, RF bias power of about 25 W, and a process gas of $C_5F_8/Ar/N_2$ with respective gas flows of 190/80/20 sccm.

In 406, the CF film is treated with $H_2O$ vapor to adsorb $H_2O$ (or OH) onto the CF film and/or incorporate $H_2O$ or (OH) into the CF film. The CF film may be maintained at a temperature between about 20° C. and about 300° C., between about 40° C. and about 400° C., or between about 60° C. and about 100° C. In other examples, the CF film may be maintained at a temperature between about 20° C. and about 60° C., between about 60° C. and about 100° C., or between about 100° C. and about 200° C. In one example, the CF film may be maintained at a temperature of about 80° C. The $H_2O$ vapor treatment may be performed at a gas pressure between about 1 Torr and about 1 atmosphere, for example. In one example, the $H_2O$ vapor treatment may be performed using a treatment gas with 80% relative humidity at atmospheric pressure.

Figure 5:
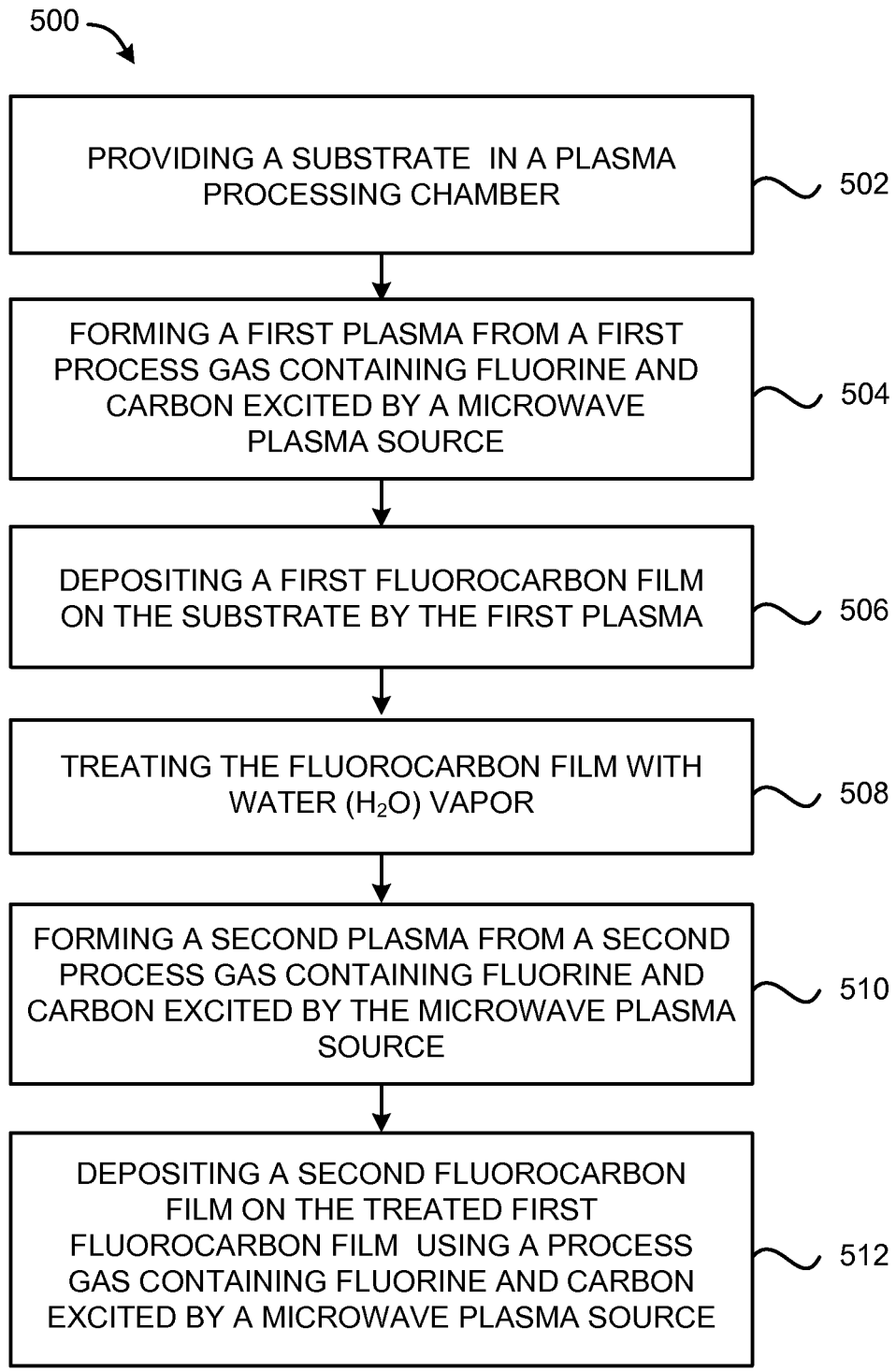
FIG. 5 is a flow diagram for forming a CF film on a substrate according to an embodiment of the invention.

FIG. 5 is a flow diagram 500 for forming a CF film on a substrate according to an embodiment of the invention and FIGS. 6A-6F schematically show formation of a CF film on a substrate according to an embodiment of the invention. Referring both to FIGS. 5 and 6A-6F, the flow diagram 500 includes, in 502, providing a substrate 600 on a substrate holder in a plasma processing chamber. According to some embodiments, a first etch stop film 602 (e.g., SiN, $SiO_2$, SiON, SiCO, SiCN, or amorphous carbon) may be present on the substrate 600. According other embodiments, the first etch stop film 602 may be omitted. The plasma processing chamber can contain a microwave antenna, a microwave power source for powering the microwave antenna, a RF power source for RF biasing the substrate holder, and optionally a DC voltage source for DC biasing the substrate holder. The microwave antenna can include a radial line slot antenna (RLSA) as schematically shown in FIGS. 8-11. The substrate 600 can, for example, be a semiconductor substrate, such as a silicon substrate, a silicon germanium substrate, a germanium substrate, a glass substrate, a LCD substrate, or a compound semiconductor substrate such as GaAs. The substrate can be of any size, for example, a 200 mm wafer, a 300 mm wafer, or an even larger wafer or substrate.

In 504, a first process gas 601 containing fluorine and carbon is introduced in the plasma processing chamber and a first plasma is formed from the first process gas using a microwave plasma source. The first process gas containing fluorine and carbon can include a $C_aF_b$ gas that contains $C_4F_4$, $C_4F_6$, $C_6F_6$, or $C_5F_8$, or a combination of two or more thereof. Other $C_aF_b$ gases are also contemplated and may be used. Gas flow rates of the $C_aF_b$ gas can be less than 500 sccm, less than 200 sccm, or less than 100 sccm. In some examples, the first process gas can further contain Ar, $N_2$, or both Ar and $N_2$. Gas flow rates of the Ar and $N_2$ gas can be less than 500 sccm, less than 200 sccm, or less than 100 sccm. The gas pressure in the plasma processing chamber can be less than 100 mTorr, less than 50 mTorr, less than 30 mTorr, or less than 20 mTorr, for example. The substrate holder can be maintained at a temperature greater than 200° C., greater than 300° C., or greater than 400° C. In some examples, the substrate holder can be maintained at a temperature greater than 310° C., greater than 320° C., or greater than 330° C. In one example, the substrate holder can be maintained at a temperature of approximately 330° C.

Figure 6A:
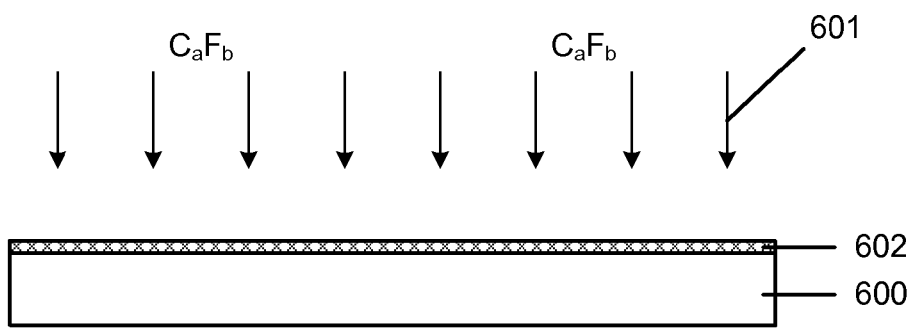
FIGS. 6A-6F schematically shows formation of a CF film on a substrate according to an embodiment of the invention.
Figure 6B:
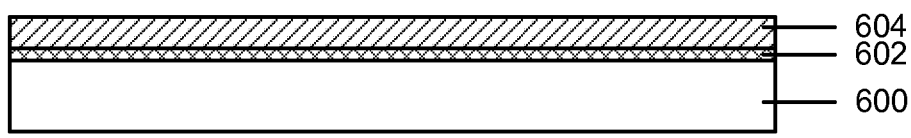

In 506, a first CF film 604 depicted in FIG. 6B is deposited on the first etch stop film 602 by the first plasma. In one example, the first CF film 604 may be formed using a chamber pressure of 23 mTorr, microwave power of 50 W, RF bias power of 25 W, and first process gas composition of $C_5F_8$/Ar/$N_2$ having respective gas flows of 190/80/20 sccm. These processing conditions can deposit the first CF film 604 with a deposition rate of about 18 nm/min (20 nm in 130 sec). In some examples, a thickness of the first CF film 604 can be 20 nm or less, for example between 5 nm and 20 nm, or between 5 nm and 10 nm, and can be about 10 nm.

Figure 6C:
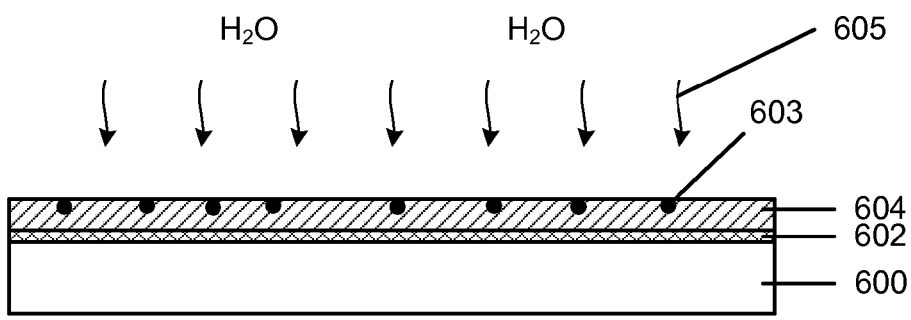
Figure 6D:
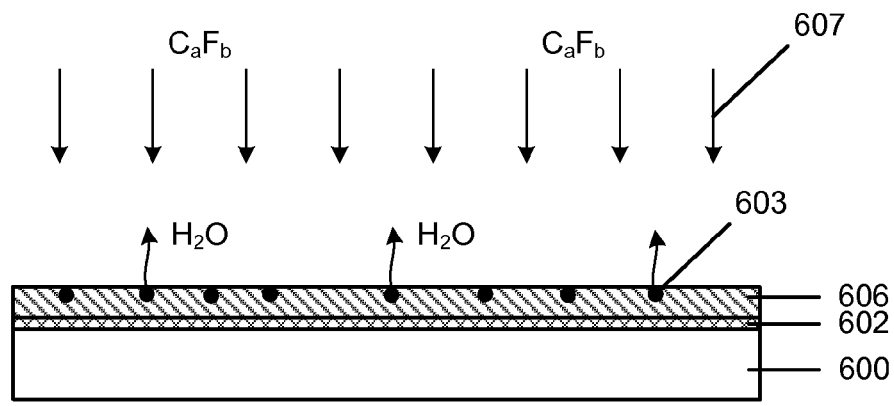
Figure 6E:
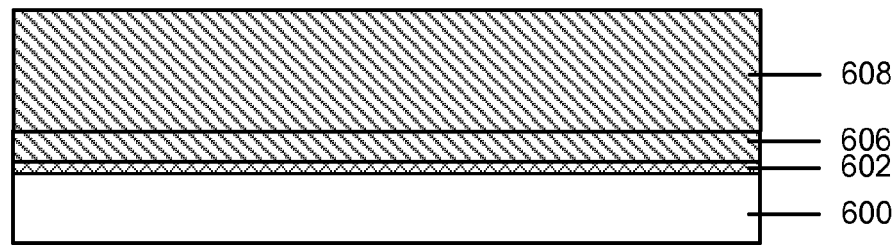

In 508, the first CF film 604 is treated with $H_2O$ vapor 605 to adsorb $H_2O$ (or OH) onto the CF film 604 and/or incorporate $H_2O$ or (OH) 603 into the first CF film 604 (FIG. 6C). The first CF film 604 may be maintained at a temperature between about 20° C. and about 300° C., between about 40° C. and about 400° C., or between about 60° C. and about 100° C. In other examples, the first CF film 604 may be maintained at a temperature between about 20° C. and about 60° C., between about 60° C. and about 100° C., or between about 100° C. and about 200° C. In one example, the first CF film 604 may be maintained at a temperature of about 80° C. The $H_2O$ vapor treatment may be performed at a gas pressure between about 1 Torr and about 1 atmosphere, for example. In one example, the $H_2O$ vapor treatment may be performed using a treatment gas with 80% relative humidity at atmospheric pressure.

In 510, a second process gas containing fluorine and carbon is introduced in the plasma processing chamber and a second plasma is formed from the second process gas using the microwave plasma source. According to some embodiments, the second process gas containing fluorine and carbon can include a $C_aF_b$ gas that contains $C_4F_4$, $C_4F_6$, $C_6F_6$, or $C_5F_8$, or a combination of two or more thereof. Other $C_aF_b$ gases are also contemplated and may be used. Gas flow rates of the $C_aF_b$ gas can be less than 500 sccm, less than 200 sccm, or less than 100 sccm. In some examples, the first process gas can further contain Ar, $N_2$, or both Ar and $N_2$. Gas flow rates of the Ar and $N_2$ gas can be less than 500 sccm, less than 200 sccm, or less than 100 sccm. The gas pressure in the plasma processing chamber can be less than 100 mTorr, less than 50 mTorr, less than 30 mTorr, or less than 20 mTorr, for example. The substrate holder can be maintained at a temperature greater than 200° C., greater than 300° C., or greater than 400° C. In some examples, the substrate holder can be maintained at a temperature greater than 310° C., greater than 320° C., or greater than 330° C. In one example, the substrate holder can be maintained at a temperature of approximately 330° C.

In 512, a second CF film 608 (FIG. 6E) is deposited on the treated first CF film 606 by the second plasma. According to some embodiments, the second process gas containing fluorine and carbon can include a $C_aF_b$ gas that contains $C_4F_4$, $C_4F_6$, $C_6F_6$, or $C_5F_8$, or a combination of two or more thereof. Other $C_aF_b$ gases are also contemplated and may be used. Gas flow rates of the $C_aF_b$ gas can be less than 500 sccm, less than 200 sccm, or less than 100 sccm. In some examples, the first process gas can further contain Ar, $N_2$, or both Ar and $N_2$. Gas flow rates of the Ar and $N_2$ gas can be less than 500 sccm, less than 200 sccm, or less than 100 sccm. The gas pressure in the plasma processing chamber can be less than 100 mTorr, less than 50 mTorr, less than 30 mTorr, or less than 20 mTorr, for example. The substrate holder can be maintained at a temperature greater than 200° C., greater than 300° C., or greater than 400° C. In some examples, the substrate holder can be maintained at a temperature greater than 310° C., greater than 320° C., or greater than 330° C. In one example, the substrate holder can be maintained at a temperature of approximately 330° C. The microwave plasma power applied by the microwave plasma source can, for example, be between 200 W and 1500 W, or between 1000 W and 1500 W. A substrate holder supporting the substrate may be biased with a RF power source. The RF bias power applied to the substrate holder can, for example, be between 10 W and 200 W, or between 20 W and 100 W.

It is contemplated that during deposition of the second CF film 608, $H_2O$ (or OH) 603 is released from the treated first CF film 606 into the plasma environment and/or into the second CF film 608. The release results in increased termination of dangling bonds in the second CF film 608 by OH groups (and possibly H and F groups) and improved thermal stability of film. It is contemplated that gaseous HF may also be released from the treated first CF film 606.

In one example, the second CF film 608 may be formed using a chamber pressure of 23 mTorr, microwave power of 1350 W, RF bias power of 25 W, and first process gas composition of $C_5F_8$/Ar/$N_2$ having respective gas flows of 190/80/20 sccm. These processing conditions can deposit a second CF film 608 with a deposition rate of about 102 nm/min (110 nm in 130 sec). In one example, a thickness of the second CF film can be 30 nm or greater, for example between 30 nm and 200 nm, or between 100 nm and 150 nm. According to some embodiments, the first CF film 604 may be thinner than the second CF film 608. According to one embodiment, the first CF film 604 may be deposited at a lower deposition rate than the second CF film 608. The treated first CF film 606 and the second CF film 608 form a combined CF film 610.

Figure 6F:
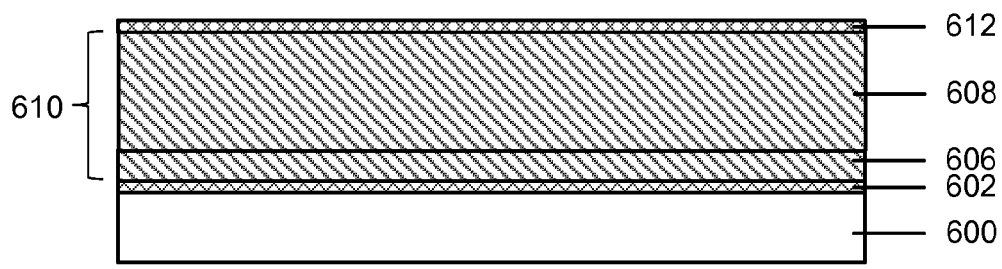

Thereafter, as depicted in FIG. 6F, a second etch stop film 612 (e.g., SiN, $SiO_2$, SiON, SiCO, SiCN, or amorphous carbon) may be deposited on the second CF film 608. According other embodiments, the second etch stop film 612 may be omitted.

In one example, a blistering test was performed on a film structure treated with $H_2O$ vapor and compared to the same film structure that did not receive a $H_2O$ vapor treatment. The film structure that was tested was similar to the film structure depicted in FIG. 6F but the etch stop films 602 and 612 contained organic dielectric layers. The first CF film had a thickness of about 10 nm and was treated with a treatment gas with 80% relative humidity at atmospheric pressure. The second CF film had a thickness of about 100 nm. The film structures were annealed for 24 hours at 350° C. in 1 atm of $N_2$ gas, and thereafter visually inspected for blisters or other defects. The visual inspection showed that the un-treated film structure exhibited severe blistering, but the $H_2O$ vapor treatment effectively prevented any blistering of the treated film structure. Further, thermal desorption data showed greatly reduced release of gaseous $CF_3$ species (m/z=69), $CF_2$ species (m/z=50) and CF species (m/z=31) from the treated film structure at temperatures of 600° C. and above, relative to the un-treated film. These results show greatly increased thermal stability of the treated film structures which allows integration of the treated CF film with other materials that are encountered in semiconductor device manufacturing.

Figure 8:
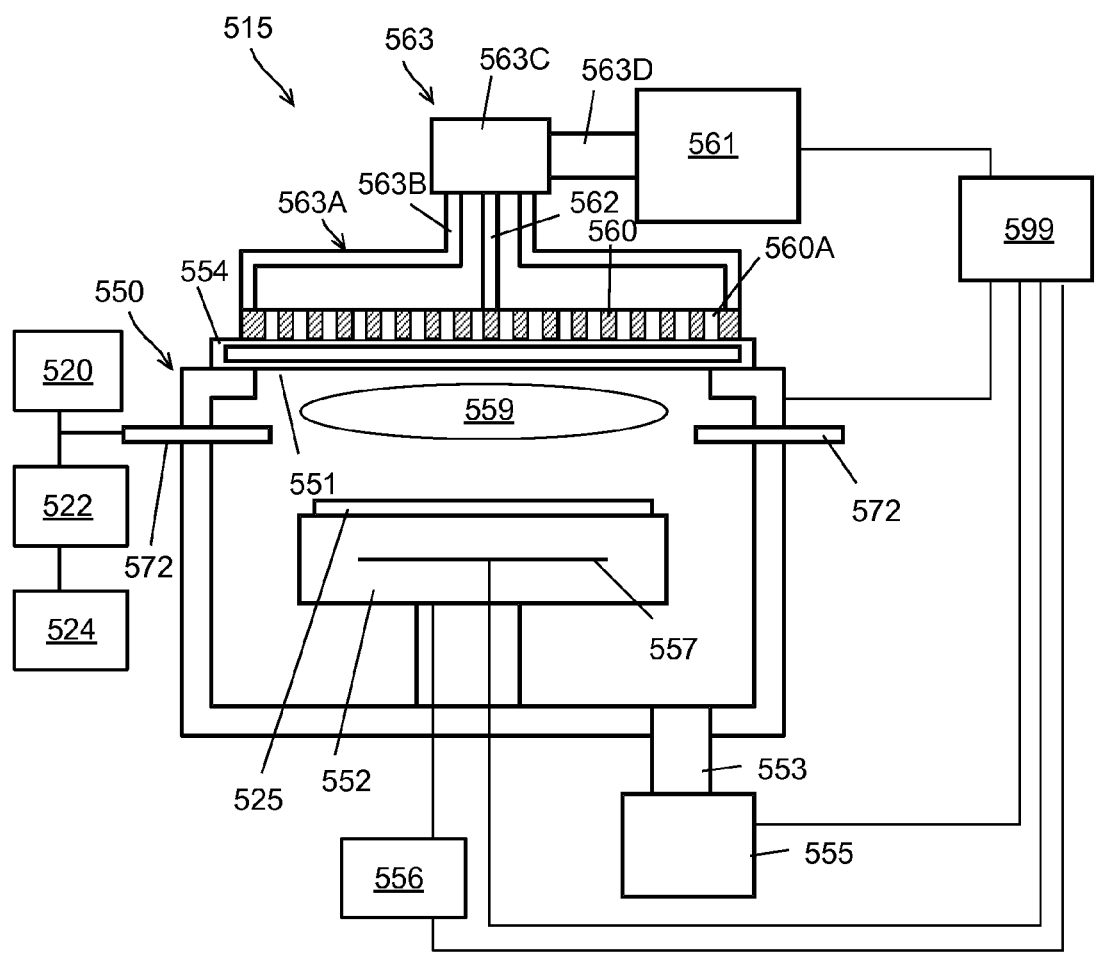
FIG. 8 is a schematic diagram of a plasma processing system containing a radial line slot antenna (RLSA) plasma source for depositing a CF film on a substrate according to one embodiment of the invention.

FIG. 8 is a schematic diagram of a plasma processing system containing a RLSA plasma source for depositing a fluorocarbon film on a substrate according to one embodiment of the invention. The plasma produced in the plasma processing system 515 is characterized by low electron temperature and high plasma density. The plasma processing system 515 can, for example, be a TRIAS™ SPA processing system from Tokyo Electron Limited, Akasaka, Japan. The plasma processing system 515 contains a plasma processing chamber 550 having an opening portion 551 in the upper portion of the plasma processing chamber 550 that is larger than a substrate 525. A cylindrical dielectric top plate 554 made, for example, of quartz, aluminum nitride or aluminum oxide is provided to cover the opening portion 551.

Gas lines 572 are located in the side wall of the upper portion of plasma processing chamber 550 below the top plate 554. In one example, the number of gas lines 572 can be 16 (only two of which are shown in FIG. 8). Alternatively, a different number of gas lines 572 can be used. The gas lines 572 can be circumferentially arranged in the plasma processing chamber 550, but this is not required for the invention. A process gas can be evenly and uniformly supplied into a plasma region 559 in plasma processing chamber 550 from the gas lines 572. A process gas containing fluorine and carbon may be supplied by the gas source 520. The process gas containing fluorine and carbon can include a $C_aF_b$ gas that contains $C_4F_4$, $C_4F_6$, $C_6F_6$, or $C_5F_8$, or a combination of two or more thereof. Other $C_aF_b$ gases are also contemplated and may be used. Gas flow rates of the $C_aF_b$ gas can be less than 500 sccm, less than 200 sccm, or less than 100 sccm. In some examples, the process gas can further contain Ar, $N_2$, or both Ar and $N_2$. Gas flow rates of the Ar and $N_2$ gas can be less than 500 sccm, less than 200 sccm, or less than 100 sccm. The gas pressure in the plasma processing chamber can be less than 100 mTorr, less than 50 mTorr, less than 30 mTorr, or less than 20 mTorr, for example.

Further, the plasma processing system 515 includes a treatment gas source 524 and a remote excitation source 522. The remote excitation source 522 may be configured for generating difluorocarbene ($CF_2$) radicals from a treatment gas (e.g., HFPO) supplied from the treatment gas source 524. Thereafter, the $CF_2$ radicals are flowed into the processing chamber 550 for treating a CF film on the substrate 525. According to one embodiment, the remote excitation source 522 can contain heating elements (e.g., resistive heating elements) configured to heat the treatment gas to a temperature between 100° C. and 500° C., or between 300° C. and 500° C., to generate $CF_2$ radicals from thermal (non-plasma) dissociation of the treatment gas. According to one embodiment, the remote excitation source 522 can contain one or more heated filaments (e.g., a resistively heated tungsten wire filament) configured to heat the treatment gas to thermally generate $CF_2$ radicals. According to one embodiment, the treatment gas may be thermally dissociated above or at the substrate 525 instead of by the remote excitation source 522. According to one embodiment, the substrate temperature (or the temperature of the substrate holder 552) may be lower than the temperature of the remote excitation source when the remote excitation source is used to thermally generate $CF_2$ radicals from the treatment gas. For example, the substrate temperature (or the temperature of the substrate holder 552) can be lower than 100° C., between 0° C. and 100° C., between 0° C. and 25° C., between 25° C. and 50° C., or between 50° C. and 100° C.

Alternatively, the treatment gas source 524 may be configured for supplying a gaseous specie having a molecular dipole, such as $H_2O$ or $NH_3$, for treating a CF film.

In the plasma processing system 515, microwave power is provided to the plasma processing chamber 550 through the top plate 554 via a slot antenna 560 having a plurality of slots 560A. The slot antenna 560 faces the substrate 525 to be processed and the slot antenna 560 can be made from a metal plate, for example copper. In order to supply the microwave power to the slot antenna 560, a waveguide 563 is disposed on the top plate 554, where the waveguide 563 is connected to a microwave power supply 561 for generating microwaves with a frequency of about 2.45 GHz, for example. The waveguide 563 contains a coaxial waveguide 563A with a lower end connected to the slot antenna 560, a coaxial waveguide 563B connected to the upper surface side of the circular (coaxial) waveguide 563A, and a coaxial waveguide converter 563C connected to the upper surface side of the circular waveguide 563B. Furthermore, a rectangular waveguide 563D is connected to the input of the coaxial waveguide converter 563C and an output for the microwave power supply 561.

Inside the coaxial waveguide 563B, an axial portion 562 (or inner conductor) of an electroconductive material is coaxially provided with the outer conductor, so that one end of the axial portion 562 is connected to the central (or nearly central) portion of the upper surface of slot antenna 560, and the other end of the axial portion 562 is connected to the upper surface of the coaxial waveguide 563B, thereby forming a coaxial structure. The microwave power can, for example, be between about 0.5 W/cm² and about 4 W/cm². Alternatively, the microwave power can be between about 0.5 W/cm² and about 3 W/cm². The microwave irradiation may contain a microwave frequency of about 300 MHz to about 10 GHz, for example about 2.45 GHz, and the plasma may contain an electron temperature of less than or equal to 5 eV, including 1, 1.5, 2, 2.5, 3, 3.5, 4, 4.5 or 5 eV, or any combination thereof. In other examples, the electron temperature can be below 5 eV, below 4.5 eV, below 4 eV, or even below 3.5 eV. In some examples, the electron temperature can be between 1 and 1.5 eV, between 1.5 and 2 eV, between 2 and 2.5 eV, between 2.5 and 3 eV, between 3.0 and 3.5 eV, between 3.5 and 4.0 eV, or between 4.0 and 4.5 eV. The plasma may have a density of about $1 \times 10^{11}$/cm³ to about $1 \times 10^{13}$/cm³, or higher.

In addition, in the plasma processing chamber 550, a substrate holder 552 is provided opposite the top plate 554 for supporting and heating a substrate 525 (e.g., a wafer). The substrate holder 552 contains a heater 557 to heat the substrate 525, where the heater 557 can be a resistive heater. Alternatively, the heater 557 may be a lamp heater or any other type of heater. Furthermore the plasma processing chamber 550 contains an exhaust line 553 connected to the bottom portion of the plasma processing chamber 550 and to a vacuum pump 555. The substrate holder 552 can be maintained at a temperature greater than 200° C., greater than 300° C., or greater than 400° C. In some examples, substrate holder 552 can be maintained at a temperature greater than 310° C., greater than 320° C., or greater than 330° C., for example. In one example, the substrate holder 552 can be maintained at a temperature of approximately 330° C.

The plasma processing system 515 further contains a substrate bias system 556 configured to bias the substrate holder 552 and the substrate 525 for generating a plasma and/or controlling energy of ions that are drawn to a substrate 525. The substrate bias system 556 includes a substrate power source configured couple power to the substrate holder 552. The substrate power source contains a RF generator and an impedance match network. The substrate power source is configured to couple power to the substrate holder 552 by energizing an electrode in the substrate holder 552. A typical frequency for the RF bias can range from about 0.1 MHz to about 100 MHz, and can be 13.56 MHz. In some examples, the RF bias can be less than 1 MHz, for example less than 0.8 MHz, less than 0.6 MHz, less than 0.4 MHz, or even less than 0.2 MHz. In one example, the RF bias can be about 0.4 MHz. Alternatively, RF power is applied to the electrode at multiple frequencies. The substrate bias system 556 is configured for supplying RF bias power can be between 0 W and 100 W, between 100 W and 200 W, between 200 W and 300 W, between 300 W and 400 W, or between 400 W and 500 W. RF bias systems for plasma processing are well known to those skilled in the art. Further, the substrate bias system 556 includes a DC voltage generator capable of supplying DC bias between −5 kV and +5 kV to the substrate holder 552.

The substrate bias system 556 is further configured to optionally provide pulsing of the RF bias power the pulsing frequency can be greater than 1 Hz, for example 2 Hz, 4 Hz, 6 Hz, 8 Hz, 10 Hz, 20 Hz, 30 Hz, 50 Hz, or greater. Examplary RF bias power can be less than 100 W, less than 50 W, or less than 25 W, for example. It is noted that one skilled in the art will appreciate that the power levels of the substrate bias system 556 are related to the size of the substrate 525 being processed. For example, a 300 mm Si wafer requires greater power consumption than a 200 mm wafer during processing.

Still referring to FIG. 8, a controller 599 includes a microprocessor, a memory, and a digital I/O port capable of generating control voltages sufficient to communicate and activate inputs of the plasma processing system 515 as well as monitor outputs from the plasma processing system 515. Moreover, the controller 599 is coupled to and exchanges information with plasma processing chamber 550, the vacuum pump 555, the heater 557, the substrate bias system 556, and the microwave power supply 561. A program stored in the memory is utilized to control the aforementioned components of plasma processing system 515 according to a stored process recipe. One example of controller 599 is a UNIX-based workstation. Alternatively, the controller 599 can be implemented as a general-purpose computer, digital signal processing system, etc.

Figure 9:
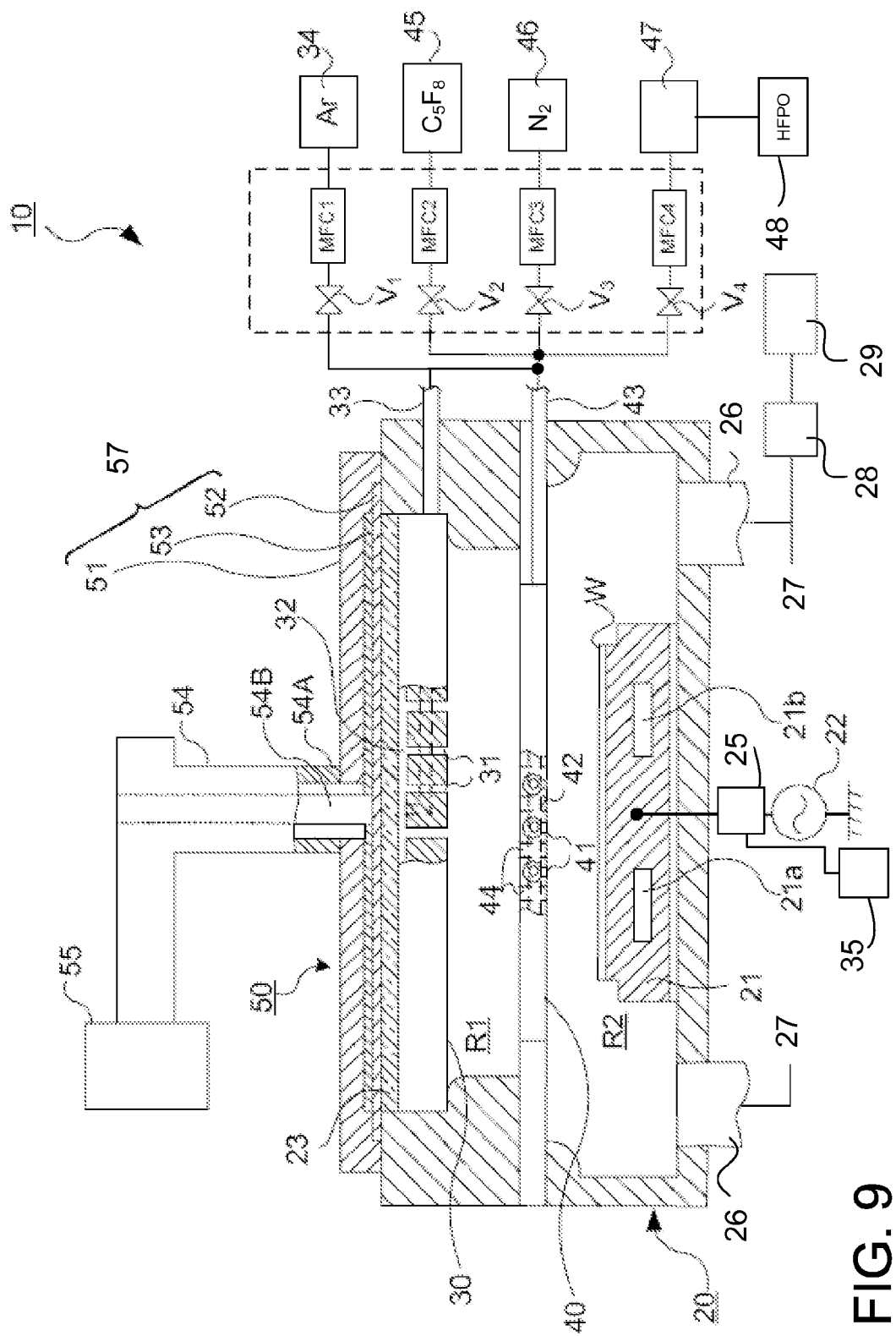
FIG. 9 is a schematic diagram of another plasma processing system containing a RLSA plasma source for depositing a CF film on a substrate according to an embodiment of the invention.

FIG. 9 is a schematic diagram of a plasma processing system containing a radial line slot antenna (RLSA) plasma source for depositing a fluorocarbon film on a substrate according to another embodiment of the invention. As shown in this figure, the plasma processing system 10 includes a plasma processing chamber 20 (vacuum chamber), an antenna unit 57 (RLSA), and a substrate holder 21. The interior the plasma processing chamber 20 is roughly sectionalized into a plasma generation region R1, located below a plasma gas supply unit 30, and a plasma diffusion region R2 at the substrate holder 21 side. The plasma generated in the plasma generation region R1 can have an electron temperature of several electron volts (eV). When the plasma is diffused into the plasma diffusion region R2, where the film formation process is performed, the electron temperature of the plasma near the substrate holder 21 drops to a value of lower than about 2 eV. The substrate holder 21 is located centrally on a bottom portion of the plasma processing chamber 20 and serves as a mounting unit for mounting a substrate W. Within the substrate holder 21, there is provided an insulating member 21a, a cooling jacket 21b, and a temperature control unit, not shown in this figure, for controlling the substrate temperature.

A top portion of the plasma processing chamber 20 is open-ended. The plasma gas supply unit 30 is placed opposite to the substrate holder 21 and is sealed with the top portion of the plasma processing chamber 20 via sealing members, not shown in this figure, such as O rings. The plasma gas supply unit 30, which may also function as a dielectric window, is made of materials such as aluminum oxide or quartz, and its planar surface, which has a virtual disk shape, faces the substrate holder 21. A plurality of gas supply holes 31 are provided opposite to the substrate holder 21 on the planar surface of the plasma gas supply unit 30. The plurality of gas supply holes 31 communicate with a plasma gas supply port 33 via a gas flow channel 32. A plasma gas supply source 34 provides plasma gas such as Ar gas, $N_2$ gas, or other inert gases, into the plasma gas supply port 33. The plasma gas is then uniformly supplied into the plasma generation region R1 via the plurality of gas supply holes 31.

The plasma processing system 10 further includes a process gas supply unit 40, which is located substantially at the centre of the plasma processing chamber 20 between the plasma generation region R1 and the plasma diffusion region R2. The process gas supply unit 40 is made of conducting materials such as aluminum alloy including magnesium (Mg) or stainless steel. Similar to the plasma gas supply unit 30, a plurality of gas supply holes 41 are provided on a planar surface of the process gas supply unit 40. The planar surface of the process gas supply unit 40 is positioned opposite to the substrate holder 21 and has a disk shape.

The plasma processing chamber 20 further includes exhaust lines 26 connected to the bottom portion of the plasma processing chamber 20, a vacuum line 27 connecting the exhaust line to a pressure controller valve 28 and to a vacuum pump 29. The pressure controller valve 28 may be used to achieve a desired gas pressure in the plasma processing chamber 20.

Figure 10:
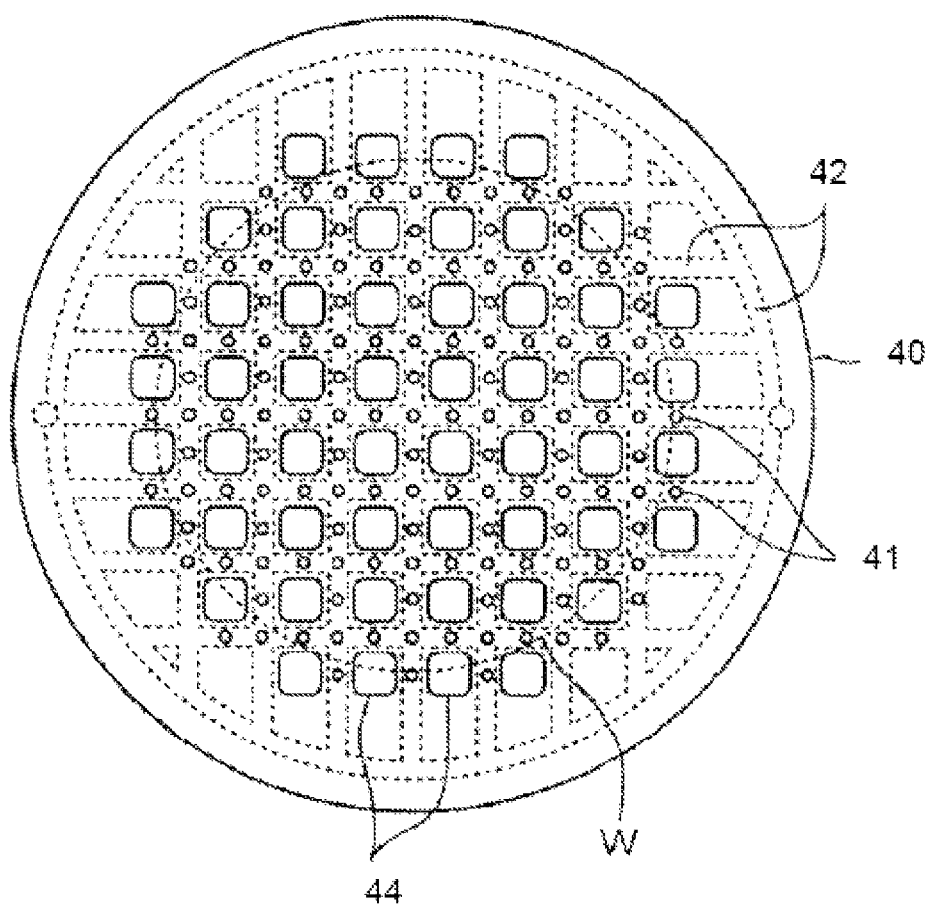
FIG. 10 illustrates a plan view of a gas supplying unit of the plasma processing system in FIG. 9.

A plan view of the process gas supply unit 40 is shown in FIG. 10. As shown in this figure, a grid-like gas flow channel 42, also called a shower plate, is formed within the process gas supply unit 40. The grid-like gas flow channel 42 communicates with an upper-end of the plurality of gas supply holes 41, which are formed in the vertical direction. The lower end of the plurality of gas supply holes 41 are openings facing the substrate holder 21. The plurality of gas supply holes 41 communicate with a process gas supply port 43 via the grid-patterned gas flow channel 42.

Further, a plurality of openings 44 are formed on to the process gas supply unit 40 such that the plurality of openings 44 pass through the process gas supply unit 40 in vertical direction. The plurality of opening 44 passes the plasma gas, e.g., argon (Ar) gas, helium (He) gas, or other inert gases, into the plasma diffusion region R2 on the side of the substrate holder 21. As shown in FIG. 10, the plurality of openings 44 are formed between the adjacent gas flow channels 42. The process gas is supplied, for example, from separate process gas supply sources 45 and 46 to the process gas supply port 43. The process gas supply sources 45 and 46 can provide $C_5F_8$ (or in general $C_aF_b$,) and $N_2$, respectively. According to some embodiments, any combination of Ar, $C_aF_b$, and $N_2$ may be flowed through the process gas supply unit 40 and/or through the plasma gas supply port 33. Furthermore, for example, the plurality of openings 44 may occupy a region on the process gas supply unit 40 that extends beyond a peripheral edge of the substrate W.

Further, the plasma processing system 10 includes a treatment gas source 48 and a remote excitation source 47. The remote excitation source 47 may be configured for generating difluorocarbene ($CF_2$) radicals from a treatment gas (e.g., HFPO) supplied from the treatment gas source 48. Thereafter, the $CF_2$ radicals are flowed into the plasma processing chamber 50 for treating a CF film on the substrate W. According to one embodiment, the remote excitation source 47 can contain heating elements (e.g., resistive heating elements) configured to heat the treatment gas to a temperature between 100° C. and 500° C., or between 300° C. and 500° C., to generate $CF_2$ radicals from thermal (non-plasma) dissociation of the treatment gas. According to one embodiment, the remote excitation source 47 can contain one or more heated filaments (e.g., a resistively heated tungsten wire filament) configured to heat the treatment gas to thermally generate $CF_2$ radicals. According to one embodiment, the treatment gas may be thermally dissociated by the substrate W instead of the remote excitation source 47. According to one embodiment, the substrate temperature (or the temperature of the substrate holder 21) may be lower than the temperature of the remote excitation source 47 when the remote excitation source 47 is used to thermally generate $CF_2$ radicals from the treatment gas. For example, the substrate temperature (or the temperature of the substrate holder 21) can be lower than 100° C., between 0° C. and 100° C., between 0° C. and 25° C., between 25° C. and 50° C., or between 50° C. and 100° C.

Alternatively, the treatment gas source 48 may be configured for supplying a gaseous specie having a molecular dipole, such as $H_2O$ or $NH_3$, for treating a CF film.

The process gas flows through the grid-like gas flow channel 42 and are uniformly supplied into the plasma diffusion region R2 via the plurality of gas supply holes 41. The plasma processing system 10 further includes four valves (V1-V4) and four flow rate controller (MFC1-MFC4) for respectively controlling a supply of the gases into the plasma processing chamber 20.

An external microwave generator 55 provides a microwave signal (or microwave energy) of a predetermined frequency, e.g., 2.45 GHz, to the antenna unit 57 via a coaxial waveguide 54. The coaxial waveguide 54 may include an inner conductor 54B and an outer conductor 54A. The microwave from the microwave generator 55 generates an electric field just below the plasma gas supply unit 30, in the plasma generation region R1, which in turn causes excitation of the process gas within the plasma processing chamber 20.

Figure 11:
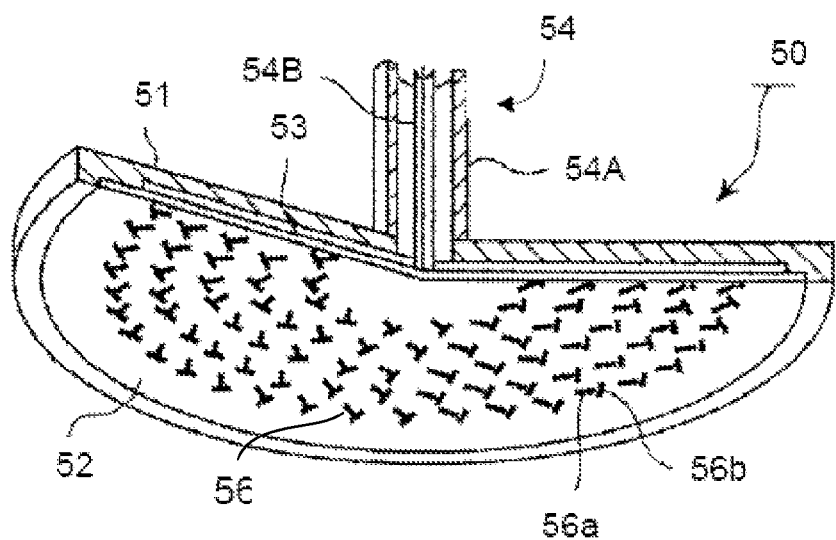
FIG. 11 illustrates a partial cross-sectional view of an antenna portion of the plasma processing system in FIG. 9.

FIG. 11 illustrates a partial cross-sectional view of the antenna unit 57 (RLSA). As shown in this figure, the antenna unit 57 may include a flat antenna main body 51, a radial line slot plate 52, and a dielectric plate 53 to shorten the wavelength of the microwave. The flat antenna main body 51 has a circular shape with an open-ended bottom surface. The radial line slot plate 52 is formed to close the open-ended bottom surface of the flat antenna main body 51. The flat antenna main body 51 and the radial line slot plate 52 are made of a conductive material with a flat hollowed circular shape waveguide.

A plurality of slots 56 are provided on the radial line slot plate 52 to generate a circular polarized wave. The plurality of slots 56 are arranged in a substantially T-shaped form having a slight gap there between, in a concentric circle pattern or a spiral pattern along a circumferential direction. Since the slots 56a and 56b are perpendicular to each other, a circular polarized wave containing two orthogonal polarized components is radiated, as a plane wave, from the radial line slot plate 52.

The dielectric plate 53 is made of a low loss dielectric material, e.g., aluminum oxide ($Al_2O_3$) or silicon nitride ($Si_3N_4$), which is located between the radial line slot plate 52 and the flat antenna main body 51. The radial line slot plate 52 is mounted on the plasma processing chamber 20 using sealing members (not shown), such that the radial line slot plate 52 is in close contact with a cover plate 23. The cover plate 23 is located on the upper surface of plasma gas supply unit 30 and is formed from a microwave transmissive dielectric material such as aluminum oxide ($Al_2O_3$).

An external high-frequency power supply source 22 is electrically connected to the substrate holder 21 via a matching network 25. The external high-frequency power supply source 22 generates an RF bias power of a predetermined frequency, e.g. 13.56 MHz, for controlling ions energy that are drawn to the substrate W. The power supply source 22 is further configured to optionally provide pulsing of the RF bias power the pulsing frequency can be greater than 1 Hz, for example 2 Hz, 4 Hz, 6 Hz, 8 Hz, 10 Hz, 20 Hz, 30 Hz, 50 Hz, or greater. The power supply source 22 is configured for supplying RF bias power can be between 0 W and 100 W, between 100 W and 200 W, between 200 W and 300 W, between 300 W and 400 W, or between 400 W and 500 W. It is noted that one skilled in the art will appreciate that the power levels of the power supply source 22 are related to the size of the substrate being processed. For example, a 300 mm Si wafer requires greater power consumption than a 200 mm wafer during processing. The plasma processing system 10 further includes DC voltage generator 35 capable of supplying DC voltage bias between −5 kV and +5 kV to the substrate holder 21.

During the forming of the CF film, the plasma gas, e.g., argon (Ar) gas, may be introduced into the plasma processing chamber 20 using the plasma gas supply unit 30. On the other hand, the process gas may be introduced into the plasma processing chamber 20 using the process gas supply unit 40.

A plurality of embodiments for forming fluorocarbon films for semiconductor devices using a microwave plasma source have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, comprising:
   providing a substrate;
   depositing a fluorocarbon (CF) film on the substrate;
   generating, in the absence of a plasma, a treatment gas containing a gaseous specie having a molecular dipole; and
   treating the CF film with the treatment gas containing the gaseous specie having the molecular dipole to reduce the number of dangling bonds in the CF film.

2. The method of claim 1, wherein the gaseous specie having a molecular dipole contains a thermally generated difluorocarbene ($CF_2$) radical.

3. The method of claim 2, wherein the difluorocarbene ($CF_2$) radical is generated by thermal decomposition of hexafluoropropylene oxide (HFPO).

4. The method of claim 1, wherein the gaseous specie having the molecular dipole contains $H_2O$, $NH_3$, or a combination thereof.

5. The method of claim 1, wherein depositing the CF film comprises:
   forming a first plasma from a first process gas containing fluorine and carbon; and
   depositing the CF film on the substrate by exposing the substrate to the first plasma.

6. The method of claim 5, wherein the first process gas containing silicon and carbon comprises $C_4F_4$, $C_4F_6$, $C_6F_6$, or $C_5F_8$, or a combination of two or more thereof.

7. The method of claim 6, wherein the first process gas further contains a noble gas, nitrogen ($N_2$), or both a noble gas and $N_2$.

8. The method of claim 5, wherein the first plasma is formed using a microwave plasma source containing a radial line slot antenna (RLSA).

9. The method of claim 1, further comprising:
depositing a second CF film on the treated CF film.

10. The method of claim 9, wherein depositing the second CF film comprises:
forming a second plasma from a second process gas containing fluorine and carbon; and
depositing the second CF film on the treated CF film by exposing the treated CF film to the second plasma.

11. The method of claim 9, wherein the CF film is thinner than the second CF film.

12. The method of claim 9, wherein the CF film is deposited at a lower deposition rate than the second CF film.

13. A method of forming a semiconductor device, comprising:
providing a substrate;
forming a first plasma from a first process gas containing fluorine and carbon;
depositing a first fluorocarbon (CF) film on the substrate by exposing the substrate to the first plasma;
generating, in the absence of a plasma, a treatment gas containing a gaseous specie having a molecular dipole;
treating the first CF film with the gaseous specie having the molecular dipole to reduce the number of dangling bonds in the first CF film;
forming a second plasma from a second process gas containing fluorine and carbon; and
depositing a second CF film on the treated first CF film by exposing the treated first CF film to the second plasma.

14. The method of claim 13, wherein the first and second process gases containing silicon and carbon comprise $C_4F_4$, $C_4F_6$, $C_6F_6$, or $C_5F_8$, or a combination of two or more thereof.

15. The method of claim 13, wherein the first and second plasmas are formed by a microwave plasma source containing a radial line slot antenna (RLSA).

16. The method of claim 13, wherein the first CF film is deposited at a lower deposition rate than the second CF film.

17. The method of claim 13, wherein the gaseous specie having a molecular dipole contains a thermally generated difluorocarbene ($CF_2$) radical.

18. The method of claim 17, wherein the difluorocarbene ($CF_2$) radical is generated by thermal decomposition of hexafluoropropylene oxide (HFPO).

19. The method of claim 13, wherein the gaseous specie having the molecular dipole contains $H_2O$, $NH_3$, or a combination thereof.

20. A method of forming a semiconductor device, comprising:
providing a substrate in a plasma processing chamber;
forming a first plasma from a first process gas containing $C_5F_8$;
depositing a first fluorocarbon (CF) film on the substrate by exposing the substrate to the first plasma;
thermally generating a difluorocarbene ($CF_2$) radical in the absence of a plasma, wherein the $CF_2$ radical is generated by thermal decomposition of hexafluoropropylene oxide (HFPO);
treating the first CF film with the $CF_2$ radical to reduce the number of dangling bonds in the first CF film;
forming a second plasma from a second process gas containing $C_5F_8$; and
depositing a second CF film on the treated first CF film by exposing the treated first CF film to the second plasma, wherein the first and second plasmas are formed by a microwave plasma source containing a radial line slot antenna (RLSA).

* * * * *